United States Patent
Yano

(10) Patent No.: US 9,296,348 B2
(45) Date of Patent: Mar. 29, 2016

(54) POWER SUPPLY DEVICE AND VEHICLE USING THE SAME

(75) Inventor: Junya Yano, Kasai (JP)

(73) Assignee: SANYO ELECTRIC CO., LTD., Osaka (JP)

(*) Notice: Subject to any disclaimer, the term of this patent is extended or adjusted under 35 U.S.C. 154(b) by 517 days.

(21) Appl. No.: 13/823,322

(22) PCT Filed: Sep. 27, 2011

(86) PCT No.: PCT/JP2011/072126
§ 371 (c)(1),
(2), (4) Date: Mar. 14, 2013

(87) PCT Pub. No.: WO2012/043592
PCT Pub. Date: Apr. 5, 2012

(65) Prior Publication Data
US 2013/0181513 A1 Jul. 18, 2013

(30) Foreign Application Priority Data

Sep. 30, 2010 (JP) .................................. 2010-223162
Jun. 15, 2011 (JP) .................................. 2011-133631

(51) Int. Cl.
*B60R 16/03* (2006.01)
*B60L 11/18* (2006.01)
(Continued)

(52) U.S. Cl.
CPC .............. *B60R 16/03* (2013.01); *B60L 11/126* (2013.01); *B60L 11/14* (2013.01); *B60L 11/1816* (2013.01);
(Continued)

(58) Field of Classification Search
CPC ..................................................... H02H 7/0816
USPC ............................................................. 307/29
See application file for complete search history.

(56) References Cited

U.S. PATENT DOCUMENTS 5,744,962 A * 4/1998 Alber ................ G01R 31/3627
324/426
6,915,220 B2 * 7/2005 Cardinal ............... B60L 3/0046
320/119

(Continued)

FOREIGN PATENT DOCUMENTS

JP 2000-74786 3/2000
JP 2003-47111 2/2003

(Continued)

OTHER PUBLICATIONS

International Search Report issued Dec. 20, 2011 in International (PCT) Application No. PCT/JP2011/072126.

*Primary Examiner* — Stephen W Jackson
(74) *Attorney, Agent, or Firm* — Wenderoth, Lind & Ponack, L.L.P.

(57) ABSTRACT

A power supply device includes functional modules, and a main controller that is connected to and controls the modules. Each module includes a battery block, a communication interface, a memory and a battery state detector. The block includes a battery cells that are connected in serial and/or in parallel to each other. The interface exchanges data with other modules or the controllers. The memory can store data exchanged through the interface. The battery state detector can detect at least one of current, voltage and temperature of the block. When the module is connected to the controller, the controller assigns a unique address to the module. The module stores the unique address, which is assigned by the controller, in the memory. The module exchanges data based on the address.

9 Claims, 11 Drawing Sheets

(51) Int. Cl.
*H02J 1/00* (2006.01)
*B60L 11/12* (2006.01)
*B60L 11/14* (2006.01)
*H01M 10/42* (2006.01)
*H01M 10/48* (2006.01)
*G01R 31/36* (2006.01)

(52) U.S. Cl.
CPC ......... *B60L 11/1842* (2013.01); *B60L 11/1844* (2013.01); *B60L 11/1846* (2013.01); *B60L 11/1866* (2013.01); *B60L 11/1874* (2013.01); *B60L 11/1879* (2013.01); *H01M 10/425* (2013.01); *H01M 10/482* (2013.01); *H02J 1/00* (2013.01); *B60L 2210/40* (2013.01); *B60L 2230/22* (2013.01); *B60L 2240/545* (2013.01); *B60L 2240/547* (2013.01); *B60L 2240/549* (2013.01); *G01R 31/3658* (2013.01); *H01M 2010/4278* (2013.01); *Y02E 60/721* (2013.01); *Y02T 10/6217* (2013.01); *Y02T 10/7005* (2013.01); *Y02T 10/7061* (2013.01); *Y02T 10/7077* (2013.01); *Y02T 10/7088* (2013.01); *Y02T 10/7241* (2013.01); *Y02T 90/121* (2013.01); *Y02T 90/127* (2013.01); *Y02T 90/128* (2013.01); *Y02T 90/14* (2013.01); *Y02T 90/16* (2013.01); *Y02T 90/163* (2013.01); *Y02T 90/169* (2013.01); *Y04S 10/126* (2013.01); *Y04S 30/14* (2013.01); *Y10T 307/50* (2015.04)

(56) References Cited

U.S. PATENT DOCUMENTS

| | | | | |
|---|---|---|---|---|
| 8,131,486 B2 * | 3/2012 | Leonard | ............ | H01M 10/482 702/182 |
| 8,525,477 B2 * | 9/2013 | Zeng | ................. | B60L 11/1853 320/106 |
| 2010/0182154 A1 | 7/2010 | Kawai et al. | | |

FOREIGN PATENT DOCUMENTS

| | | |
|---|---|---|
| JP | 2008-99482 | 4/2008 |
| JP | 2009-89521 | 4/2009 |
| JP | 2010/146991 | 7/2010 |

* cited by examiner

POWER SUPPLY DEVICE AND VEHICLE USING THE SAME

BACKGROUND OF THE INVENTION

1. Technical Field

The present invention relates to a power supply device that includes a battery block constructed of plurality of battery cells, and a vehicle using this power supply device. The present invention relates more particularly to a power supply device that is installed on an electric vehicle such as hybrid car and electric car and suitable as a power supply for supplying electric power to an electric motor for driving the vehicle, and a vehicle using this power supply device.

2. Description of the Related Art

A number of battery cells are serially connected to each other to increase the output voltage whereby increasing the output electric power of vehicle power supply device. A power supply device has been developed which includes battery blocks each of which is constructed of a number of rectangular battery cells that are arranged side by side whereby increasing the volumetric charge density of the power supply device. This type of battery block is constructed as a module. In the case where a plurality of battery modules are connected to each other in series and/or in parallel, the power supply device can be provided capable of meeting different voltage and current specifications.

Also, a high-functionality module (i.e., so-called functional module or intelligent module) has been proposed. A circuit board is provided in each high-functionality battery module in order to individually control the battery capacity and voltage of this battery module, the temperature of battery cells in this battery module, and the like (see Japanese Patent Laid-Open Publication No. JP 2010-146,991 A).

In the case where a number of connected functional modules are connected to each other, it will be necessary for functional modules to exchange data through data communications or the like. To achieve this data communications, it is necessary assign individual IDs to the functional modules so that the functional module can be distinguished from each other. According to this construction, for example, if a malfunction occurs in one functional module, it is possible to identify the malfunctioned functional module. The following approaches can be conceived which assign IDs to functional modules. For example, each functional module includes a hardware component such as DIP switch or connecting pin that can provide a variable ID number (address) so that IDs can be individually assigned to functional modules. A predetermined ID number is previously assigned to each functional module. Each functional module is constructed to be provided with an ID number by software. In this approach, after functional modules are connected to each other, IDs are incrementally assigned to the functional modules in the connection order. Among these approaches, in the case where ID numbers are assigned by hardware, the work of assigning ID numbers to functional modules is a burden. In particular, as the number of the connected functional modules increase, the burden of the assignment will increase. In the case where predetermined ID numbers are previously assigned to functional modules, it is necessary to assign the ID numbers to the functional modules when the functional modules are produced. For this reason, in this approach, the productivity will be poor. As compared with the approaches, in the case where IDs are assigned to functional modules after the functional modules are connected to each other, the functional modules can be produced in the same manner in terms of hardware, and it is easy to assign the IDs to the functional modules. From this viewpoint, this approach is advantageous. This approach is known in JP 2010-146,991 A.

Also, see Japanese Patent Laid-Open Publication No. JP 2003-47,111 A

However, in the known functional module, there is a problem that the ID assignment construction is complicated, and the ID assignment process takes a long time.

The present invention is aimed at solving the above problem, and its main object is to provide a power supply device for more flexible ID assignment, and a vehicle using this power supply device.

SUMMARY OF THE INVENTION

To achieve the above object, a power supply device according to a first aspect of the present invention includes a plurality of functional modules, and a main controller that is connected to and controls the plurality of functional modules. Each of the plurality of functional modules includes a battery block, a communication interface, a memory portion and a battery state detection portion. The battery block includes a plurality of battery cells that are connected in serial and/or in parallel to each other. The communication interface exchanges data with other of the functional modules or the main controllers. The memory portion can store data that is exchanged through the communication interface. The battery state detection portion can detect at least one of current, voltage and temperature of the battery block. When the functional module is connected to the main controller, the main controller assigns a unique address to the functional module. The functional module stores the unique address, which is assigned by the main controller, in the memory portion. The functional module exchanges data based on the address. According to this construction, in a power supply device that includes a plurality of functional modules that are connected to each other, when the functional module are connected to each other, addresses can be automatically assigned to the functional modules by the main controller. As a result, it is possible to distinguish the plurality of functional modules from each other in data communications without concern for assignment of numbers or the like to the functional modules. Also, according to this construction, although the functional modules can be produced in the same manner in terms of hardware, it is only required to individually assign their addresses to the functional modules in use. Accordingly, it is possible to save the workers from assigning the addresses to the functional modules. Therefore, there is an advantage that the manufacturing cost can be reduced. In addition, since the functional modules can store their unique addresses when the unique addresses are transmitted from the main controller to the functional modules, the main controller can collectively assign and manage the unique addresses. Therefore, it is possible to simplify assignment and management processing in the functional modules, and to reduce the loads of the functional modules.

In a power supply device according to a second aspect of the present invention, the plurality of functional modules and the main controller can be connected through a communication bus to each other. According to this construction, there is an advantage that the modules can be connected to each other and exchange data with each other through the communication network using the communication bus.

In a power supply device according to a third aspect of the present invention, the memory portion can be a nonvolatile memory.

In a power supply device according to a fourth aspect of the present invention, the plurality of functional modules can be connected to the main controller through the communication bus in the power supply device assembling process. The main controller can assign the unique addresses to the functional modules through the communication bus in the order of the turning-on of the power to the functional modules. The functional modules can store their unique addresses in the nonvolatile memories when recognizing the unique addresses. The functional modules can exchange data based on the unique addresses on next startup. According to this construction, the unique addresses can be automatically assigned to the functional modules when the functional modules are connected to each other.

In a power supply device according to a fifth aspect of the present invention, the main controller can be connected to the functional modules through startup signal lines AC through which startup signals are transmitted for activating/deactivating the functional modules. On startup of the power supply device, the main controller can transmit the startup signals to the functional modules through the startup signal lines AC so that the functional modules are activated. The main controller can assign the unique addresses to the functional modules, and transmit the unique addresses through the communication bus to the functional modules. The functional modules can store their unique addresses in the nonvolatile memories when recognizing the unique addresses. The functional modules can exchange data based on the unique addresses on next startup.

In a power supply device according to a sixth aspect of the present invention, on startup of the power supply device, if one of the functional module has not stored its unique address, the one of the functional module can transmit an identification signal to another of the functional modules that is connected on the upstream side relative to the one of the functional module based on an identification signal that is transmitted from the main controller. The upstream end module of the functional modules that is connected at the upstream end without connection to the functional module on the upstream side can create and store its unique address based on the identification signal, and transmit the unique address to the downstream-side module of the functional modules that is connected on the downstream side relative to the upstream end module. The downstream-side functional module can create and store its unique address based on the unique address that is transmitted from the upstream-end functional module. The unique addresses can be assigned to the functional modules by sequentially repeating the unique address transmission. The functional modules can exchange data with the main controller based on their assigned unique addresses.

In a power supply device according to a seventh aspect of the present invention, the power supply device can be a vehicle power supply device.

In a power supply device according to an eighth aspect of the present invention, the power supply device can be a power storage type power supply device.

A vehicle according to a ninth aspect of the present invention includes the aforementioned power supply device.

DETAILED DESCRIPTION OF THE INVENTION

The following description will describe embodiments according to the present invention with reference to the drawings. It should be appreciated, however, that the embodiments described below are illustrations of a power supply device and a vehicle including this power supply device to give a concrete form to technical ideas of the invention, and a power supply device and a vehicle including this power supply device of the invention are not specifically limited to description below. Furthermore, it should be appreciated that the members shown in claims attached hereto are not specifically limited to members in the embodiments. Unless otherwise specified, any dimensions, materials, shapes and relative arrangements of the members described in the embodiments are given as an example and not as a limitation. Additionally, the sizes and the positional relationships of the members in each of drawings are occasionally shown larger exaggeratingly for ease of explanation. Members same as or similar to those of this invention are attached with the same designation and the same reference signs, and their description is omitted. In addition, a plurality of structural elements of the present invention may be configured as a single part that serves the purpose of a plurality of elements, on the other hand, a single structural element may be configured as a plurality of parts that serve the purpose of a single element. Also, the description of some of examples or embodiments may be applied to other examples, embodiments or the like. In this specification, the terms "upstream side" and "downstream side" mean that in functional modules that are connected to each other through a communication line, in the case where one of the functional modules that is connected on one node end side is defined as an upper stream-side functional module, another functional module that is connected on another node end side relative to this the upper stream-side functional module is referred to as a downstream-side functional module. In a plurality of functional modules that are connected in series to each other, in the case where one of the functional modules is defined as a particular functional module, the functional module that is connected on the upstream side relative to the particular functional module is referred to as an "upstream-side" functional module while the functional module that is connected on the downstream side relative to the particular functional module is referred to as a "downstream-side" functional module. Alternatively, the functional module that is connected on the near side to a master controller relative to a particular functional module can be referred to as an "upstream-side" functional module, while the functional module that is connected on the remote side relative to the particular functional module can be referred to as a "downstream-side" functional module.

First Embodiment

Figure 1:
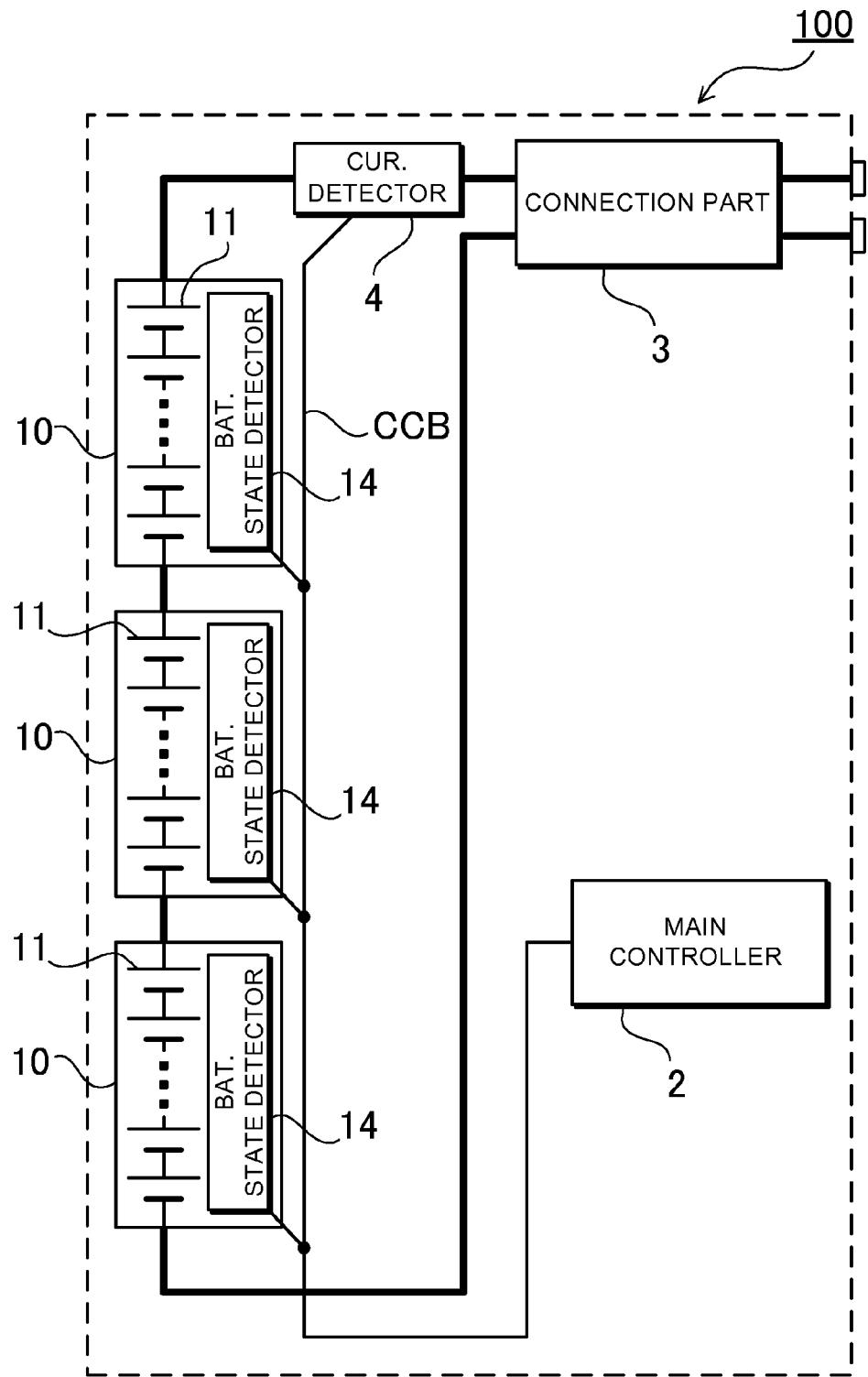
FIG. 1: Block diagram showing a power supply device according to a first embodiment.

FIG. 1 is a block diagram showing a power supply device 100 according to a first embodiment of the present invention. The power supply device 100 can be installed on hybrid cars or electric cars as a battery pack system that includes a plurality of battery cells, and used as a power supply that supplies electric power to an electric motor for driving the cars. It will be appreciated that the power supply device according to the present invention is not limited to vehicle power supply devices, and can be suitably used as other power supply devices that are required to produce a large output. The illustrated power supply device includes a plurality of functional modules 10, a main controller 2, a connection portions 3, and a current detection portion 4.

(Functional Module 10)

Figure 2:
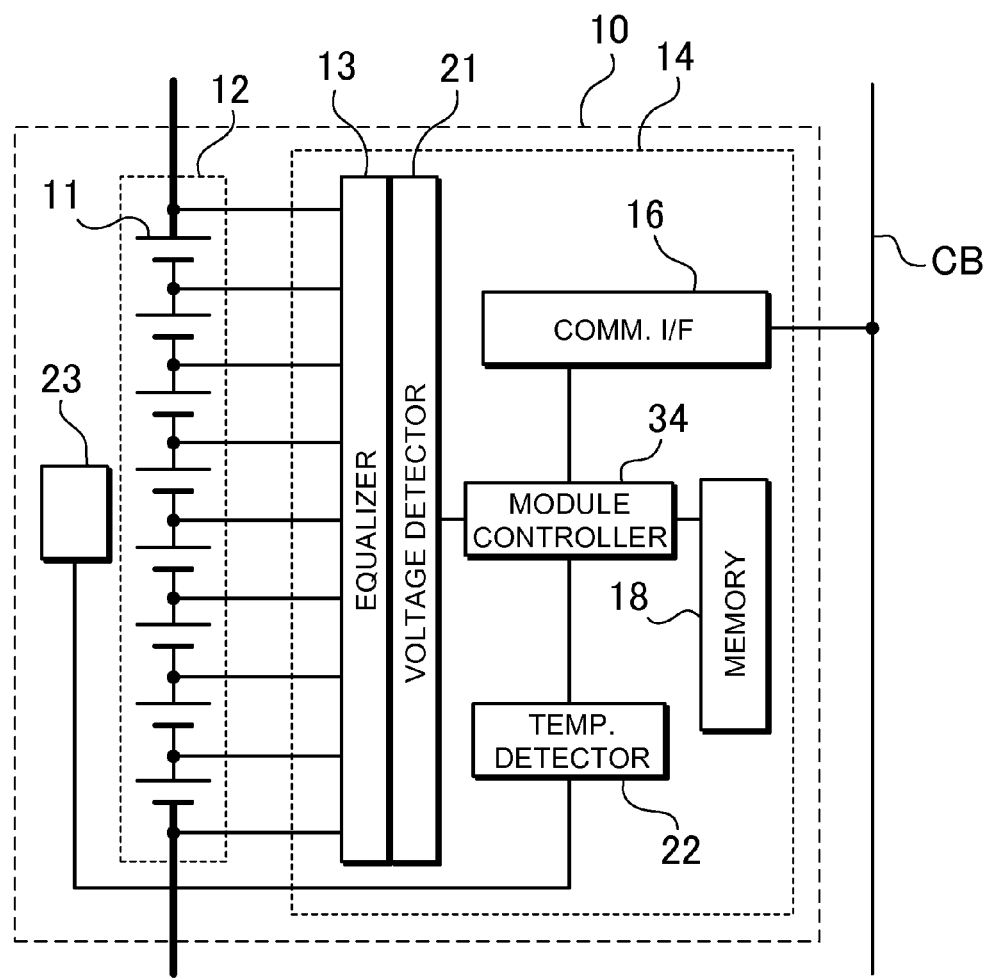
FIG. 2: Block diagram showing the construction a functional module.

FIG. 2 is a block diagram showing the functional module 10. The functional module 10 includes a battery block 12, and a battery state detection portion 14. The battery block includes battery cells 11 that are arranged side by side. The battery state detection portion can detect the states of the battery cells 11. The battery state detection portion 14 includes an equalization circuit 13, a voltage detection part 21, a temperature detection part 22, a module-side control part 34, a communication interface 16, and a memory part 18. The equalization circuit 13 equalizes the remaining capacities among the battery cells 11. The voltage detection part 21 can detect the cell voltages of the battery cells 11. The temperature detection part 22 can detect the temperature of the battery cells 11. The module-side control part 34 controls the circuit and the parts. The communication interface 16 can exchange data with other of the functional modules 10 or the main controllers 2. The functional module 10 can exchange data by using the communication interface 16 data with other functional modules and the main controller 2 through a common communication bus COB. The common communication bus COB is a bidirectional communication line. Temperature sensors such as PTCs and thermistors are connected to the temperature detection part 22.

(Communication Interface 16)

The communication interface 16 has the function of data communication. The adjacent functional modules 10 can be connected to each other by the communication interfaces through the common communication bus COB. It will be appreciated that although the illustrated functional module shown in FIG. 2 includes one communication interface 16, the functional module may include more than one communication interfaces. In this case, one of the communication interfaces is connected to the upstream-side functional module 10, while another communication interface is connected to the downstream-side functional module 10 so that the communication bus, which connects the adjacent functional modules 10 to each other, can be short. As a result, it is possible to reduce the possibility of noise appearance on the communication bus.

(Connection Topology of Communication Interfaces 16)

In the illustrated connection topology shown in FIG. 1, the functional modules 10 are independently connected to the common communication bus COB. The communication interfaces 16 of the functional modules 10 are connected to branches that are added to to the main section of the common communication bus COB. According to this distributed connection topology, an additional functional module can be additionally connected to the functional modules 10 through the common communication bus COB if necessary. In addition to the functional modules 10, other members may be connected to the common communication bus COB. In this case, the communication line can be simple. The common communication bus COB is constructed of a bidirectional communication line.

Figure 3:
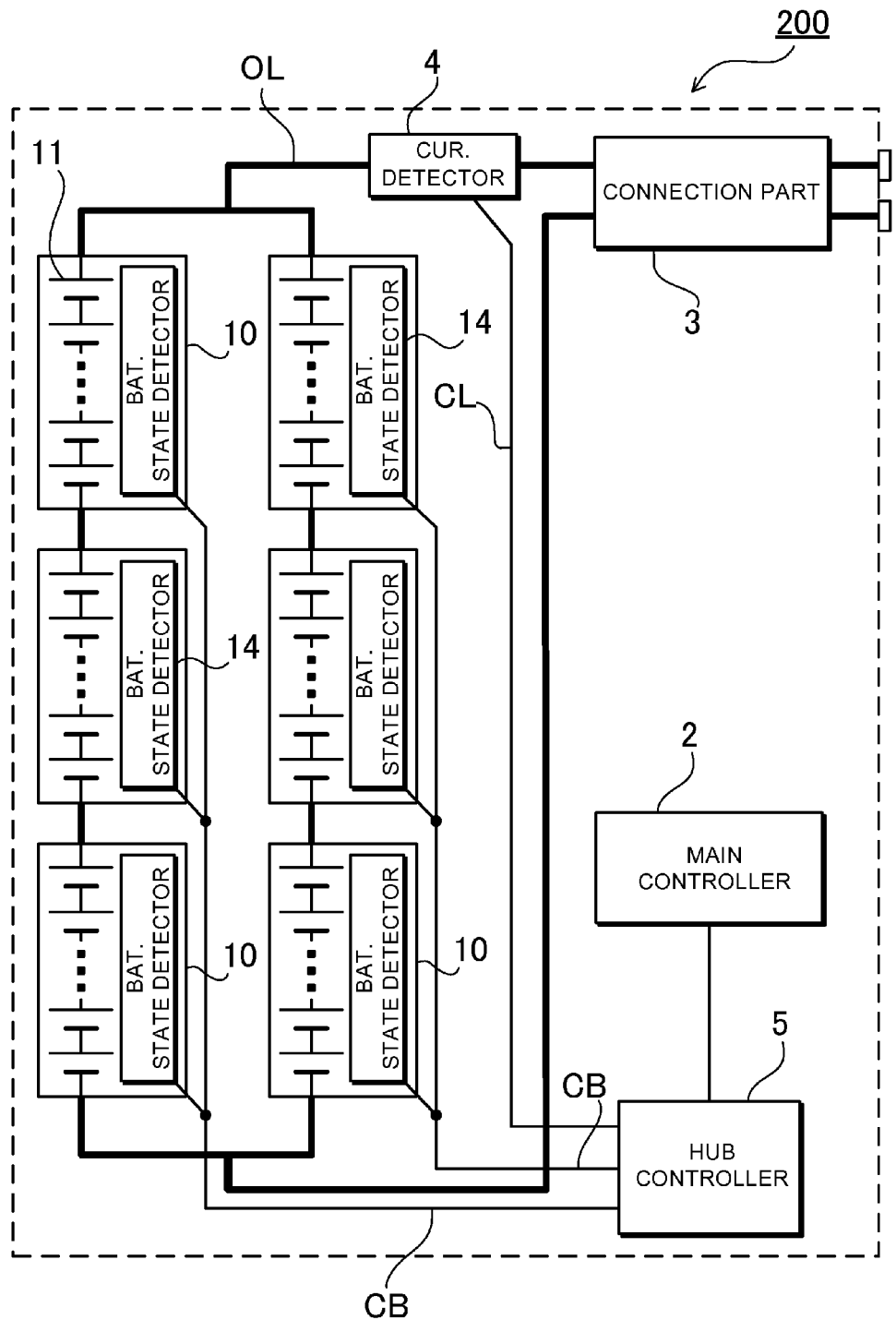
FIG. 3: Block diagram showing a power supply device according to a second embodiment.

In the embodiment of FIG. 1, the main controller 2 is directly connected to the functional modules 10 through the common communication bus COB. It will be appreciated that in the case where the power supply device includes many functional modules or in the case where a plurality of module assemblies 1 each of which includes serially-connected functional modules are connected in parallel to each other the functional modules or the module assemblies can be connected to the main controller through a hub. FIG. 3 shows this type of power supply device as a second embodiment. In this illustrated power supply device 200, a hub controller 5 is connected between the main controller 2 and the module assemblies 1. The functional modules 10 are connected through a plurality of communication bus cables CB to the hub controller 5 in a star topology. In the case where the hub controller 5 is connected to the main controller 2, communication can be collectively carried out through the plurality of communication bus cables CB.

Needless to say, the main controller and the functional modules can be connected to each other in other suitable topologies such as daisy chain, loop and star topologies. For example, in the case of loop topologies, bidirectional communication lines are not required for the communication bus, unidirectional communication lines can be used as the communication bus. In the case of star topologies, since the functional modules are individually connected to the main controller, interference will not occur in data communications. Accordingly, it is not necessary to add individual identifications to communication data packets. Also, there is an advantage that even if any of the communication bus cables is disconnected so that some functional modules cannot communicate with the main controller, the other functional modules still can communicate with the main controller. Any suitable connection topology between the main controller and the functional modules can be selected depending on applications and purposes.

Any suitable existing communications protocol such as CAN (Controller Area Network), FlexRay, AUTOSAR and JasPar can be used for communications through the communication bus.

(Module Assembly 1)

The positive and negative terminals of the battery block 12 of each of the functional modules 10 are connected to an output line OL. The module assembly 1 is constructed of the functional modules 10 that are connected to the output line OL in series. The module assembly 1 supplies the outside through the connection portion 3 with output power that is produced by the serially-connected battery blocks 12. To address this, the connection portion 3 includes output power terminals.

Although three functional modules 10 are connected to each other in series in the embodiment of FIG. 1, the number of connected modules can be three or less, or five or more. Also, the functional modules can be connected both in serial and parallel to each other. As discussed above, the output voltage and the current value can be adjusted by adjusting the number of connected functional modules and the serial/parallel connection.

(Current Detection Portion 4)

The current detection portion 4 is connected on the output line OL. The current detection portion 4 can detect an output current that flows on output line OL from the module assembly 1. In the embodiment of FIG. 1, the current detection portion 4 is connected to the main controller 2 through the communication bus CB. In this case, the main controller 2 can monitor the states of the battery cells 11 in the functional modules 10 through the communication bus CB. Also, the main controller can monitor the output current through a current signal line CL. The main controller can transmit information on the state and the output current to external devices, and can provide the functional module 10 with instructions to disconnect some of the battery cells 11. The current detection portion 4 is not necessarily connected to the main controller for interactive communications. For example, in the embodiment of FIG. 3, the current detection portion 4 is connected to the main controller 2 through the current signal line CL that is separately provided from the communication bus CB. The main controller 2 can receive information on the output current, which is detected by the current detection portion 4, through the current signal line CL. In this embodiment, the current detection portion 4 does not exchange data with the main controller 2. The main controller 2 merely obtains current signals that are detected by the current detection portion 4 in an I/O connection manner.

As discussed above, each of the functional modules 10 does not necessarily include the current detection portion 4, but the single current detection portion 4 is connected on the output line OL. Since the single current detection portion 4 is connected to the main controller 2, the current detection portion 4 can serve as a common current sensor. In other words, since each of the functional modules 10 does not necessarily include the current sensor, the functional modules can be simplified.

Figure 4:
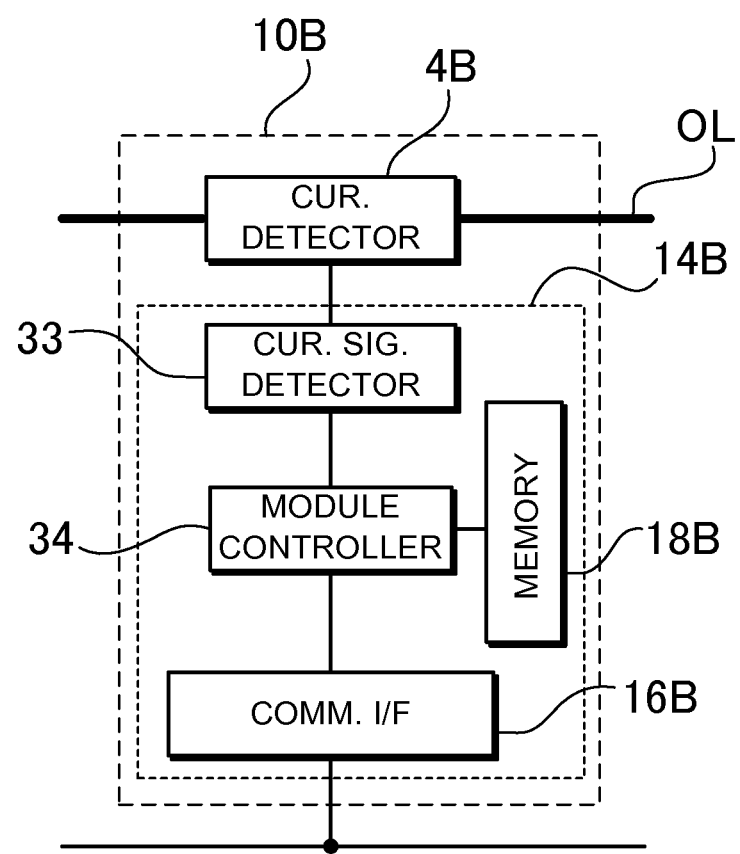
FIG. 4: Block diagram showing a power supply device according to a third embodiment.

It will be appreciated that each of the functional modules may the current detection portions. FIG. 4 shows this type of functional module according to a third embodiment. This illustrated functional module 10B includes a current detection portion 4B, and a battery state detection portion 14B. The battery state detection portion 14B includes a current signal detection part 33, a module-side control part 34, and a memory part 18B, and a communication interface 16B. According to this construction, the functional module can detect the current in addition to cell voltages. As a result, there is an advantage that the states of the battery cells can be more accurately monitored and protected.

(Battery State Detection Portion 14)

Dissimilar to conventional battery modules as assemblies that include only side-by-side arranged battery cells, the functional module 10 shown in the FIG. 1, etc. includes a circuit board 20 that includes a protection circuit, which can protect the battery block 12 of side-by-side arranged battery cells 11, and the like installed on the circuit board. The battery state detection portion 14 is mounted on the circuit board 20. The battery state detection portion 14 can detect the temperature, voltage, current and the like of the battery block 12. In addition, the circuit board 20 can include the protection circuit that can interrupt the circuit if an abnormal voltage is detected.

(Voltage Detection Part 21)

The battery state detection portion 14 includes the voltage detection part 21, which can detect the voltages of the battery cells 11 included in the functional module 10. It is preferable that each of the battery cells 11 be provided with a voltage detector of the voltage detection part 21. In the case where the voltage of each battery cell is monitored in order to properly detect abnormalities particularly in rechargeable lithium-ion batteries, it is possible to ensure the safety of the module. It will be appreciated that the voltage detection part may detect only a particular point of the battery block such as both ends of the battery block and the central battery cell. The voltage detection part 21 and the communication interface 16 are arranged in proximity to the battery cells 11. In the case where the voltage detection part 21 is arranged in proximity to the battery block 12 particularly through short wire harnesses, FPC (Flexible printed circuits) or the like, it is possible prevent a short circuit between detection lines.

The voltage detection parts 21 and communication interfaces 16 may be installed on a single chip. In this case, the circuit board 20 of the functional module 10 can be small. The circuit board 20 may be directly mounted on the end surface of the battery block 12.

The functional module 10 can transmit information on the cell voltages of the battery cells 11 to the main controller 2 through the communication interface 16. Thus, the main controller 2 can collectively monitor the cell voltages of the battery cells 11 of the functional modules 10.

(Temperature Detection Part 22)

The battery state detection portion 14 includes the temperature detection part 22, which can detect the temperature of the battery cells 11 included in the functional module 10. A temperature detector of the temperature detection part 22 is arranged only on a particular battery cell 11 such as the battery cell 11 the temperature of which tends to be highest (for example, the battery cell that is arranged in the central part of the battery block 12 or on the downstream part of cooling air path), and the battery cell the temperature of which tends to be lowest (for example, the battery cell that is arranged on the end surface side of the battery block 12 or on the upstream part of cooling air path). Needless to say, it will be appreciated that each of the battery cells may be provided with the temperature detector.

(Memory Part 18)

The memory part 18 stores data that is exchanged through the communication interface 16. Nonvolatile memories such as E2PROM can be used as the memory part 18. The nonvolatile memory can store the unique address as ID that identifies the functional module 10, the battery capacities (SOC) of the battery cells included in the functional modules, the battery life information (SOH), and the like. When the unique addresses are assigned to the functional modules 10, it is possible to distinguish the connected functional modules 10 from each other.

The data that is stored in the memory part 18 is rewritable based on the signal from the main controller 2. Accordingly, when the main controller 2 transmits necessary data to the functional modules 10, the functional module 10 can store the data. Thus, the main controller 2 can collectively manages the functional modules 10. Accordingly, the processing of the functional module 10 can be simplified. As a result, it is possible to reduce the load of the functional module. For example, when the unique address as ID is assigned to the functional module 10 from the main controller 2 in order that the main controller 2 can identify the functional module 10, the functional module 10 writes its unique address into the memory part 18.

(Unique Address)

When detecting that the functional modules 10 are connected to the communication bus CB, the main controller 2 can assign their unique addresses to them. Thus, the functional modules 10 can have their unique addresses, and can exchange data with the main controller 2 through the communication bus CB based on the unique addresses. Since the unique addresses can be automatically assigned, there is an advantage that the work of assigning the unique addresses can be saved. Also, in production of the functional modules 10, the unique addresses are not previously fixed. Accordingly, the functional modules 10 can be produced in the same manner in terms of hardware. As a result, there is an advantage that the functional modules can be produced at low cost.

The procedure of the unique address assignment is now described. During assembly of power supply device, after the main controller 2C is previously powered, the functional modules 10C and the current detection portion 4C are connected to the main controller one by one. When the functional module 10C or the current detection portion 4C is connected to the main controller 2C, the main controller 2C can assign a unique address to the functional module or the current detection portion in the connection order.

Alternatively, in the power supply device that has been assembled, when the functional modules 10 are connected to the main controller or the communication bus, the main controller 2 may detect the connection and automatically create unique addresses, which are transmitted to the functional modules 10.

The functional module 10 recognizes the transmitted unique address, and writes and stores its unique address into the memory part 18. After that, the functional module can exchange data communications based on its unique address. Thus, the functional module 10 can obtain its unique address, and can exchange data with the main controller 2 based on the obtained unique address.

An exemplary assignment process is now described. In the case where one of the functional modules does not have its unique address when the functional modules are connected to the main controller 2C, if a unique address can be assigned to this functional module, unique addresses are assigned one by one to the functional modules. Specifically, the unique address can be assigned every when the functional module 10C is connected one by one to the main controller 2C. On startup of the power supply device, if detecting that the functional module 10C is additionally connected to the main controller 2C, the main controller 2C will check the unique address of the additional functional module 10C. If determining that the unique address has not been assigned to the additional functional module 10C, the main controller will create a new unique address that has not been assigned to the other functional module, and transmit the new unique address to the additional functional module. The additional functional module 10C can store the assigned unique address into the memory part 18 so that the assigned unique address is used as its ID. As a result, the additional functional module can be distinguished from the other functional modules. After the main controller assigns the new unique address to the additional functional module 10C, when another functional module 10C is additionally connected to the main controller, the main controller will assign another new unique address to the another additional functional module similarly one after another. Thus, the unique addresses can be assigned to all of the functional modules 10C by repeating the assignment process. According to the assignment process, the main controller 2C is only required to assign the unique addresses one after another every when the functional module is additionally connected to the main controller. In other words, in the case where a plurality of functional modules do not have their unique addresses, it is not necessary to simultaneously assign different IDs to the plurality of functional module. For this reason, there is an advantage that the ID assignment configuration or processing can be simplified. In addition, the simplification of configuration results in the simplification of wiring, which in turn can provide improved noise immunity, cost reduction and the like. Accordingly, although an inexpensive controller can be used as the main controller 1C, the unique addresses can be assigned to a plurality of functional modules one after another by the aforementioned procedure.

However, the present invention is not limited to this. The power supply device can be constructed so that when the functional modules that do not have their unique addresses are simultaneously connected to the main controller the main controller can assign the individual unique addresses to the functional modules. In this case, the controller can be constructed to determine whether the functional module is additionally connected to the main controller and whether the additional functional module has its unique address, and to assign a new unique address to the additional functional module if the additional functional module does not have its unique address. Alternatively, In order to reduce the load of the controller, the functional module may have the unique address assignment function. Another exemplary assignment process is now described. In this process, the unique addresses are assigned the functional modules 10C that are connected to the main controller. On startup of the power supply device system, the main controller 2C first checks connection of the functional modules 10C, and determines whether the functional modules have their unique addresses, similarly. If the main controller 2C determines that some of or all of the functional modules 10C do not have their unique addresses, the main controller will transmit identification signals to some of or all of the functional modules 10C. The identification signal instructs the functional module to create its ID. If the functional module 10 does not have its unique address, when this functional module 10 receives the identification signal that is transmitted from the main controller 2, this functional module 10 transmits an identification signal to another functional module 10 that is connected on the upstream side relative to this functional module 10. Subsequently, the another functional module 10C, which receives this identification signal, transmits the identification signal to still another upstream-side functional module 10C. Thus, the identification signal can be transmitted to the upstream side through the functional modules 10C one after another. The upstream end module of the functional modules 10 that is connected at the upstream end without connection to the functional module 10 on the upstream side creates and stores its unique address into the memory part 18 when the upstream end module receives the identification signal. After that, the upstream end functional module 10C transmits the unique address to the downstream-side functional module 10. The downstream-side functional module 10 creates and stores its unique address into the memory part based on the unique address that is transmitted from the upstream-end functional module 10. Also, this downstream-side functional module 10C similarly transmits the unique address to another downstream-side functional module 10. Thus, the unique addresses can be assigned to the functional modules 10 by sequentially repeating the unique address transmission. As a result, the functional modules can exchange data with the main controller 2 based on their assigned unique addresses. According to this construction since the controller does not execute all the processes but the functional modules execute the unique address assignment process, the load of the processing of the controller can be reduced. As a result, there is an advantage that the hardware configuration or specifications required for the controller can be simple. It will be appreciated that the assignment processes are illustrative, and various changes and modifications can be made. For example, even if the functional module already has stored its unique address, when the functional module receives a new unique address, the functional module may rewrite the new unique address into the memory part. Alternatively, even when the functional module receives a new unique address, the functional module may hold its unique address that has been stored, and transmit an ID to the downstream-side functional module 10C that is connected next to this the functional module.

The plurality of functional modules 10 can be connected to the main controller 2 through the communication bus in the power supply device assembling process. The main controller 2 can assign the unique addresses to the functional modules through the communication bus in the order of the turning-on of the power to the functional modules. The functional modules 10 can store their unique addresses in the nonvolatile memories when recognizing the unique addresses. The functional modules 10 can immediately exchange data based on the unique addresses on next startup. According to this construction, the unique addresses can be automatically assigned to the functional modules when the functional modules are connected to each other.

(Battery Cell 11)

The battery block 12 includes the battery cells 11, which can be connected to each other in serial and/or in parallel. In the embodiment shown in FIG. 1, the battery cells 11 are connected in series to each other. The lithium ion batteries can be suitably used as the battery cells 11. Since the voltage of the lithium ion battery is high, even in the case where a small number of lithium ion batteries are connected in series to each other, the output voltage of the lithium ion batteries can be high. However, other types of rechargeable batteries such as nickel metal hydride batteries and nickel-cadmium batteries can be used as the battery cells. The output voltage of the battery block 12 can be adjusted by the number of the battery cells 11 that are connected in series to each other. In addition, the output voltage of the power supply device 100 can be adjusted by the number of the functional modules 10 that are connected in series to each other. In the case where the power supply device 100 serves as the device for supplying electric power to an electric motor for driving a vehicle, a plurality of battery blocks 12 are connected in series to each other so that the power supply device can supply an output voltage of 100 to 400 V, preferably 200 to 300 V.

(Equalization Circuit 13)

The battery state detection portion 14 includes the equalization circuit 13 that equalizes the remaining capacities of the plurality of battery cells 11 that are included in the battery block 12. When receiving equalization instructions from the main controller 2, the functional module 10 activates the equalization circuit 13 so that the remaining capacities of the battery cells 11 are equalized among the battery cells. The equalization circuit 13 connects the battery cell the voltage or remaining capacity of which is high through a resistor to the ground so that the remaining capacity of this battery cell is brought equal to the remaining capacities of the other battery cells. To address this, closed circuits can be formed of the battery cells and the equalization circuit. The equalization circuit opens/closes switches of the closed circuits, and equalizes the remaining capacities of the battery cells. According to this construction, the main controller 2 can collectively manage and properly maintain the balance of the cells in each of the functional modules 10. That is, it is possible to reduce the load of processing of the functional module 10, and to simplify the construction of the functional module 10. In addition, a block voltage equalization circuit may be provided which is constructed to maintain the balance of the voltages of the battery blocks among the functional modules. Alternatively, driving power may be supplied from the functional module with high block voltage to other functional modules so that the remaining capacities of the functional modules cells can be equalized.

(Electric Car)

Figure 5:
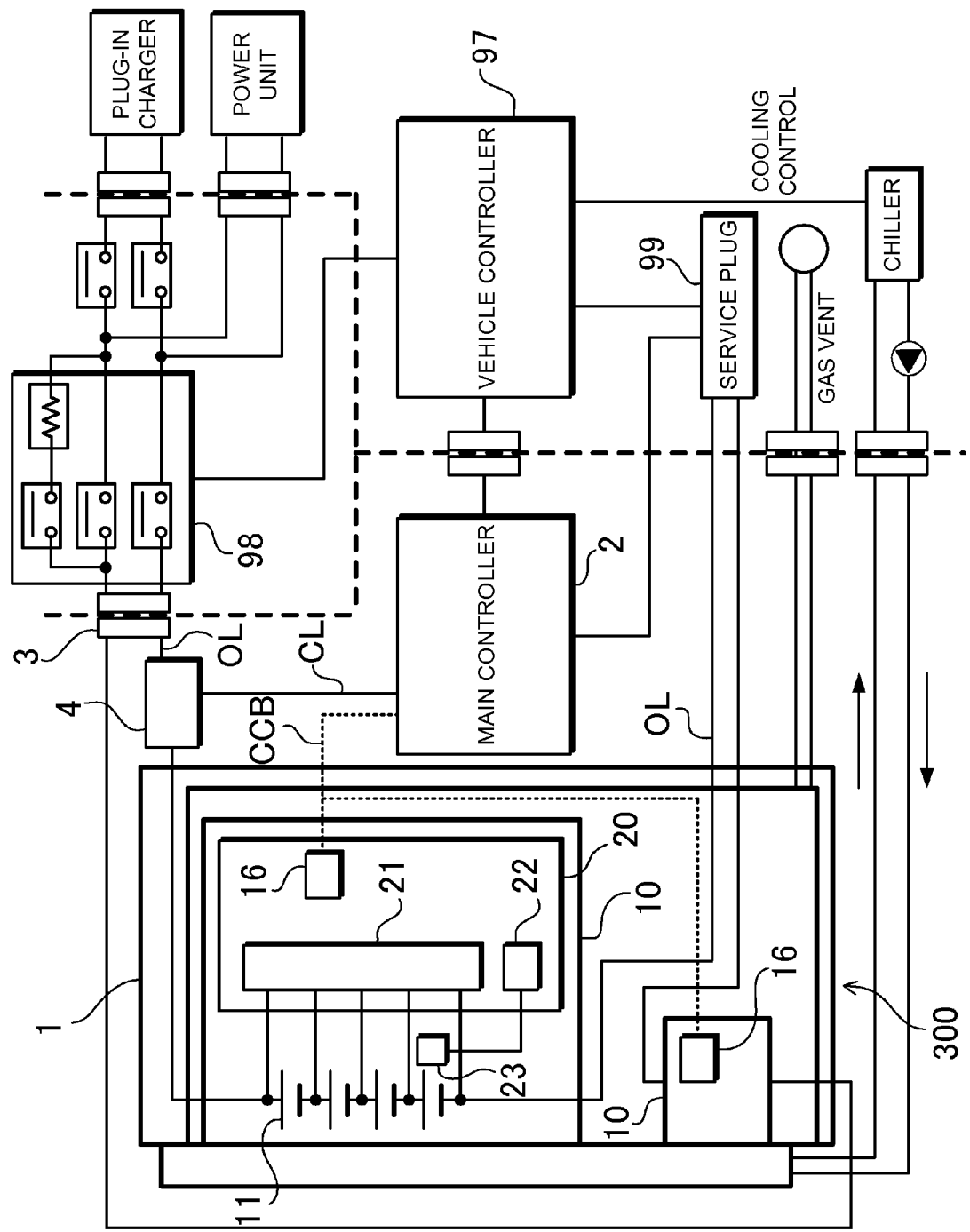
FIG. 5: Block diagram showing the detailed construction of the power supply device.

FIG. 5 is a block diagram showing an exemplary electric car that includes the power supply device. An exemplary power supply device 300 shown in FIG. 5 includes two functional modules 10, which are connected to each other. The current detection portion 4 is connected to the main controller 2 through a dedicated bus, which is provided separately from the communication bus CB. The main controller 2 serves as power supply device side ECU (Electronic Control Unit). The ECU can detect the output current, and control the functional modules 10 and the communication bus CB. Also, the ECU can exchange data with a vehicles side controller 97, which is an external device and connected to the ECU. Accordingly, the main controller 2 is connected through a low voltage connector to the vehicles side controller 97. The connection portion 3 includes a high voltage connector that connects the output line OL of the module assembly 1 to a vehicle side contactor unit 98. A service plug 99 is connected on the path of the output line OL. The service plug can ensure safety in maintenance, and the like.

The functional module 10 can be constructed of the circuit board 20 without high-performance calculation element. In this case, the main controller executes complex calculation. For example, the functional module can only have very simple IC, ASIC or the like in addition to the memory part, the equalization circuit and the like on the circuit board. In this case, there is an advantage that the circuit construction can be simple and small, and the cost of the functional module can be reduced. When calculation processes such as calculation of SOC or SOH are required, the main controller, which is connected to the functional module through the communication bus, performs the calculation processes. Accordingly, the hardware specifications required for the functional module can be simple. As a result, the functional module can be produced at low cost. Since the required processes can be collectively performed by the main controller, the power supply device is not inferior to conventional power supply devices in terms of functionality. The required functions of the power supply device are maintained. In the case where the functions of the functional module are limited so that the functional modules have a common hardware structure, it is possible to substantially reduce the component cost of the functional module. In addition, in the case where the functional modules have a common hardware structure, even if a malfunction occurs in one functional module, only the malfunctioned functional module can be replaced. As a result, the functional modules that have a common hardware structure are advantageous in maintenance.

Every when the functional module 10 is additionally connected to the main controller 2, the main controller can recognize the additionally-connected functional module 10, and then can automatically create and transmit a new unique address to the additionally-connected functional module 10. Thus, the additionally-connected functional module 10 can exchange data based on the assigned unique address in the power supply device.

(Startup Signal Line AC)

Figure 6:
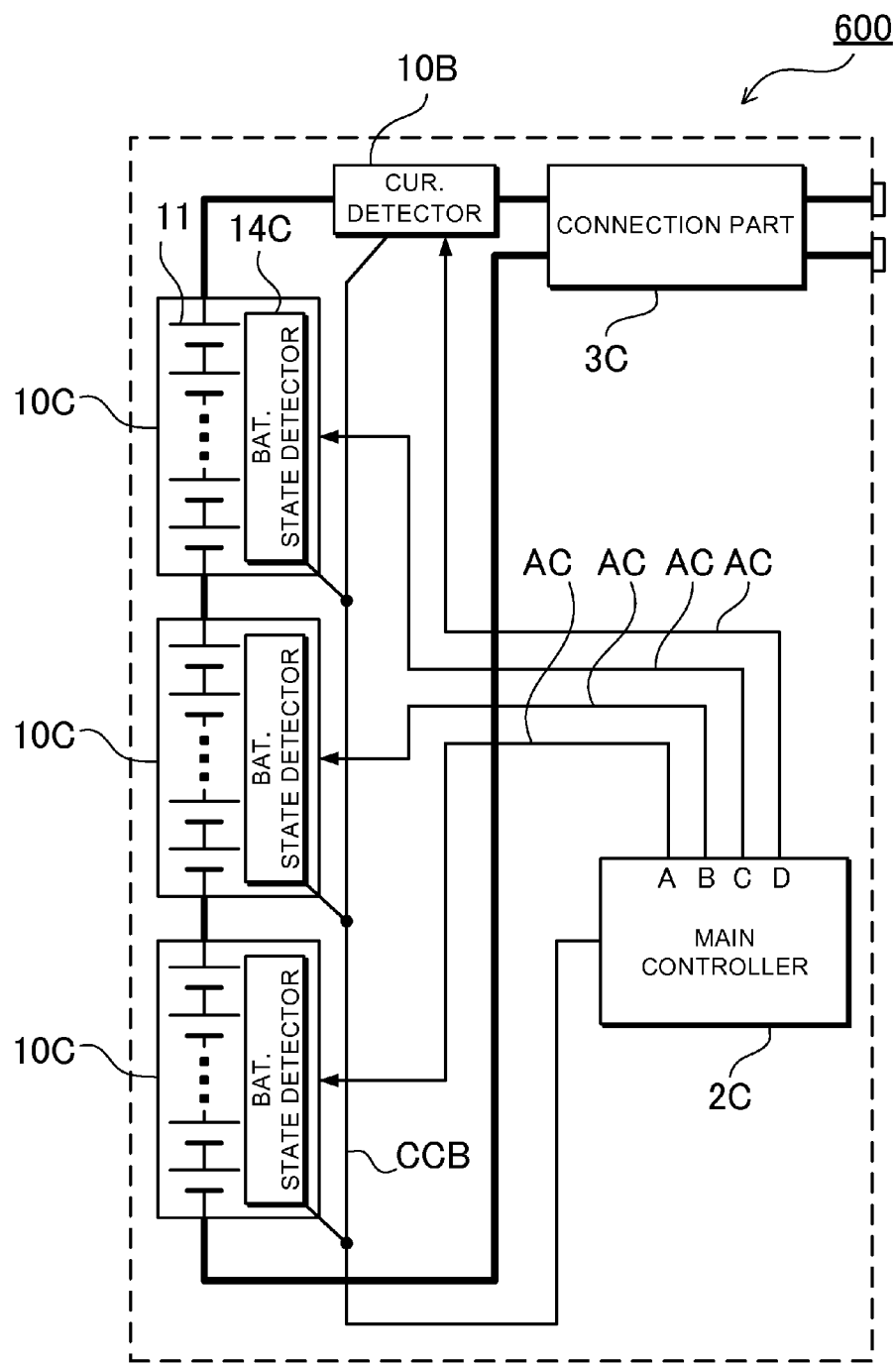
FIG. 6: Block diagram showing a power supply device according to a sixth embodiment.

In addition, startup signal lines AC can be connected to the functional modules. The functional modules can be activated/deactivated through the startup signal lines. FIG. 6 shows a power supply device 600 according to a sixth embodiment. In this illustrated power supply device 600, a plurality of functional modules 10C are connected through the output line OL to each other in series. The connection portion 3C is connected at the end of the output line OL. Each of the functional modules 10C includes the battery state detection portion 14C that monitors the battery cells 11. A functional module 10B is connected as the current detection portion, and includes the aforementioned current detection portion 4B shown in FIG. 4. The functional modules 10C and 10B are connected to the main controller 2C through the common communication bus CCB. Also, the functional modules 10C and 10B are connected to the main controller 2C also through the startup signal lines AC, which are provided separately from the common communication bus CCB. Startup signals can be transmitted through the startup signal lines AC from the main controller 2C to the functional modules. The functional modules can be activated/deactivated based on the startup signals. In this construction, the functional module 10B, which serves as the current detection portion, is controlled similar to the functional modules 10C. That is, a unique address is assigned to the functional module 10B.

The main controller 2C can transmit the startup signals to the functional modules through the startup signal lines AC at any timing. For example, on startup of the power supply device, the startup signals can be transmitted to the functional modules so that the functional modules are activated. After that, the power supply device will check the unique addresses of the functional modules. If it is determined that some of or all of the functional modules do not have their unique addresses, unique addresses will be assigned to the some of or all of the functional modules. That is, the unique address can be transmitted through the communication bus to the functional module that does not have its unique address. When receiving this unique address, the functional module stores it into the nonvolatile memory. This functional module can immediately exchange data based on the assigned and stored unique address on next startup. Thus, the functional modules can have their unique addresses, and can exchange data with the main controller through the communication bus based on the unique addresses. Since the unique addresses can be automatically assigned, there is an advantage that the work of assigning the unique addresses can be saved. Also, in production of the functional modules, the unique addresses are not previously fixed. Accordingly, the functional modules can be produced in the same manner in terms of hardware. As a result, there is an advantage that the functional modules can be produced at low cost. Alternatively, the functional modules may recognize the unique addresses that are created by the main controller when the functional modules are connected to the main controller. Thus, the functional modules may start exchanging data based on these unique addresses.

(Construction of Functional Module 10)

Figure 7:
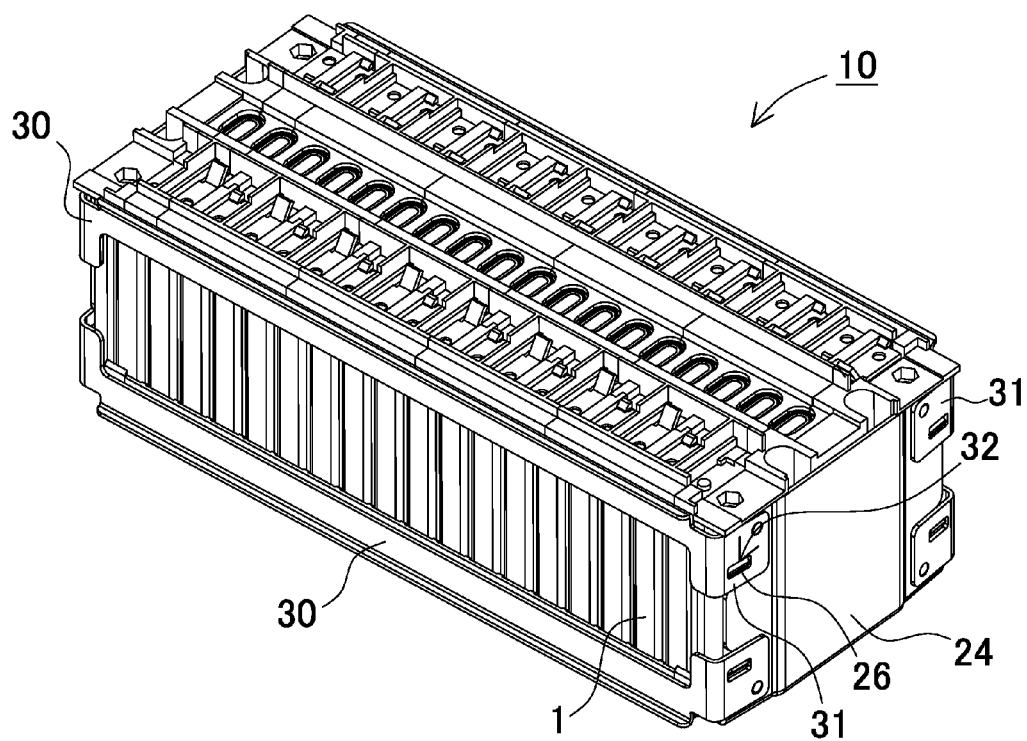
FIG. 7: Perspective view showing the outward appearance of the functional module.
Figure 8:
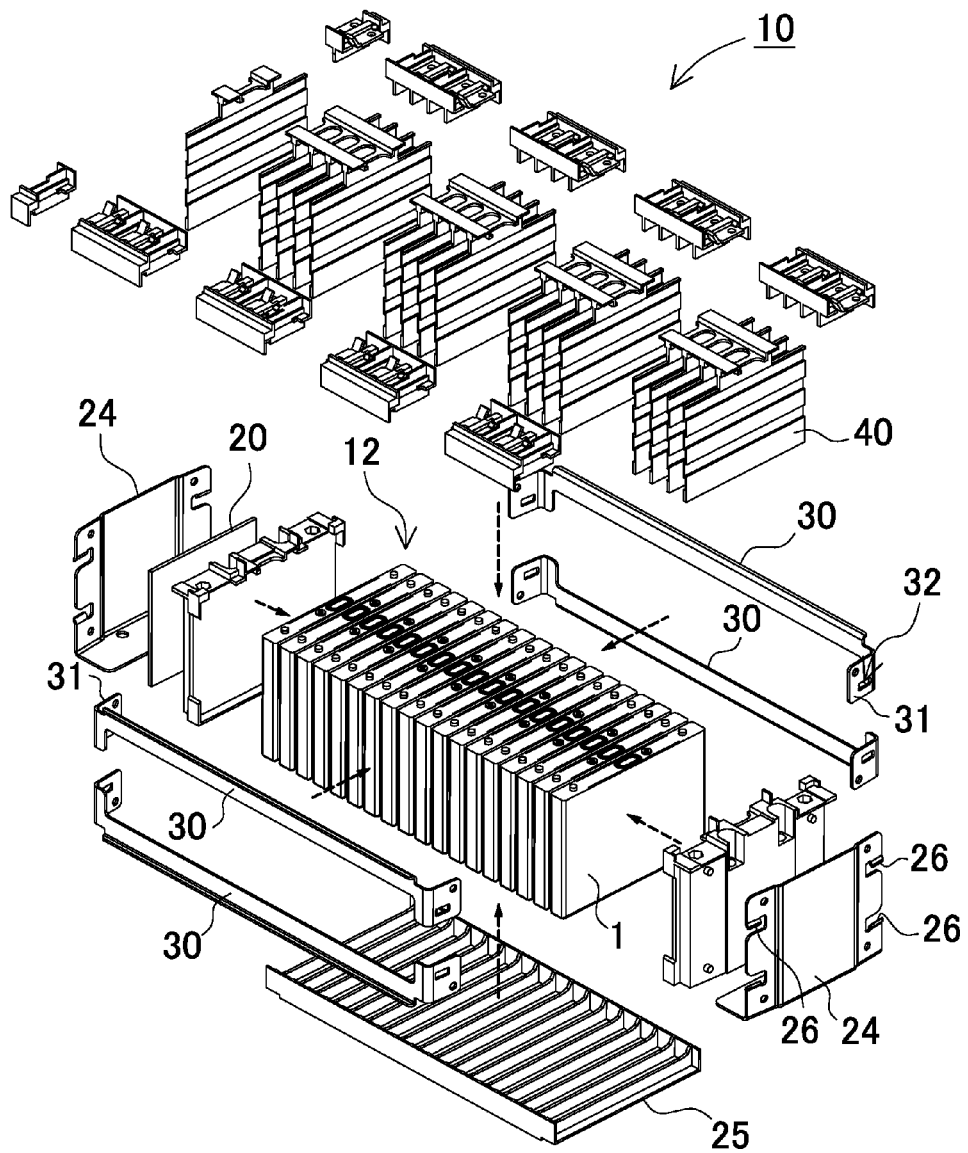
FIG. 8: Exploded perspective view showing the functional module.

FIG. 7 is a perspective view showing an exemplary outward appearance of functional module 10. FIG. 8 is an exploded perspective view of the functional module shown in FIG. 7. This illustrated functional module 10 includes the battery block 12, and the circuit board 20. In this exemplary functional module, the battery block 12 is constructed of the rectangular battery cells 11, which are arranged side by side, and is secured by bind bars 30. In addition, the circuit board 20 is provided with various circuits such as the protection circuit that protect the battery cells 11 in abnormal conditions.

(Battery Block 12)

As shown in FIG. 7, the battery block 12 has a box-shaped outward appearance. A number of rectangular battery cells 11 are arranged side by side in the battery block. The battery block is sandwiched between end plates 24 that are arranged on the both end surfaces, and secured by the bind bar 30. In the battery block 12, as shown in the exploded perspective view of FIG. 8, separators 40 are interposed between the rectangular battery cells 11. In the exemplary battery block 12 shown in FIG. 8, eighteen rectangular battery cells 11 are arranged side by side. The bind bars 30 serves as fasteners for fastening the battery cells 11. In the exemplary battery block, the both end parts of the elongated metal plate are bent so that metal plate has a rectangular U shape as viewed from the top side. The both end parts serve as bent parts 31. The bent part 31 has a slit 32 that can receive a protrusion 26 on the end plate 24. In this battery block 12, when the protrusions 26 of the end plates 24 are fitted into the slits 32 of the bent parts 31 of the bind bars 30, the battery cells 11 are arranged side by side and secured to each other with the separators 40 being interposed between the battery cells.

(Battery Cell 11)

The battery cell 11 is constructed of an exterior container that has an exterior shape with a thickness smaller than its width. The battery cell includes the positive/negative terminals, which are arranged on a sealing plate. The sealing plate closes the top opening of the exterior container. In other words, the sealing plate seals the exterior container. The terminals are electrically connected to each other through bus bars. The exterior case of the battery cell may be formed of an electrically insulating material such as plastic. In this case, since the electrically-insulating exterior containers of the battery cells are not necessarily electrically insulated from each other when being arranged side by side, the separator may be formed of metal. In addition, the surfaces except the top surface of the battery cell 11 are subjected to an electrically insulating process. Specifically, the surfaces other than the top and bottom surfaces of the battery cell 11 are covered with a covering film.

The battery cells 11 are lithium-ion rechargeable batteries. However, the battery cells may be nickel metal hydride battery batteries or nickel-cadmium batteries. The battery cell 11 has a rectangular shape with a predetermined thickness, and includes positive/negative terminals and an opening for a safety valve. The positive/negative terminals protrude from the end parts of the top surface of the battery cell. The opening is located in the middle of the top surface of the battery cell. The positive or negative terminals of one battery cell 11 is connected by the bus bar to the negative or positive terminals of another battery cell that is arranged side by side adjacent to the one battery cell so that the battery cells are serially connected to each other. In the case of the battery system in which the adjacent battery cells 11 are serially connected to each other, the output voltage of the battery system can be high, and as a result the battery system can provide high power. However, in the battery system according to the present invention, adjacent battery cells may be connected in parallel to each other.

(Separator 40)

In the battery block 12, the separators 40 are interposed between the battery cells 11, which are arranged side by side. In the battery block 12, the exterior container 12 of the rectangular battery cell 11 is formed of metal. The separator 40 is formed of plastic, and electrically insulates the adjacent battery cells from each other. The separator 40 has a shape that allows the battery cells 11 to fit in the both surface sides of the separator. As a result, it is possible to prevent that the battery cells 11 adjacent to the separator are deviated from the predetermined positions when the battery cells are arranged side by side.

As shown in FIG. 8, the separator 40 can have the cooling gaps, which are formed between the battery cells 11. Cooling gas such as air can pass through the cooling gaps to cool the battery cells 11. According to this construction, the battery cells 11 are arranged side by side with the cooling gaps being formed between battery cells in the battery block 12. In addition, a blower mechanism (not shown) is provided as a cooling mechanism that forcedly blows cooling gas to cool the battery cells 11 of the battery block 12.

(Vehicle Using Power Supply Device)

Figure 9:
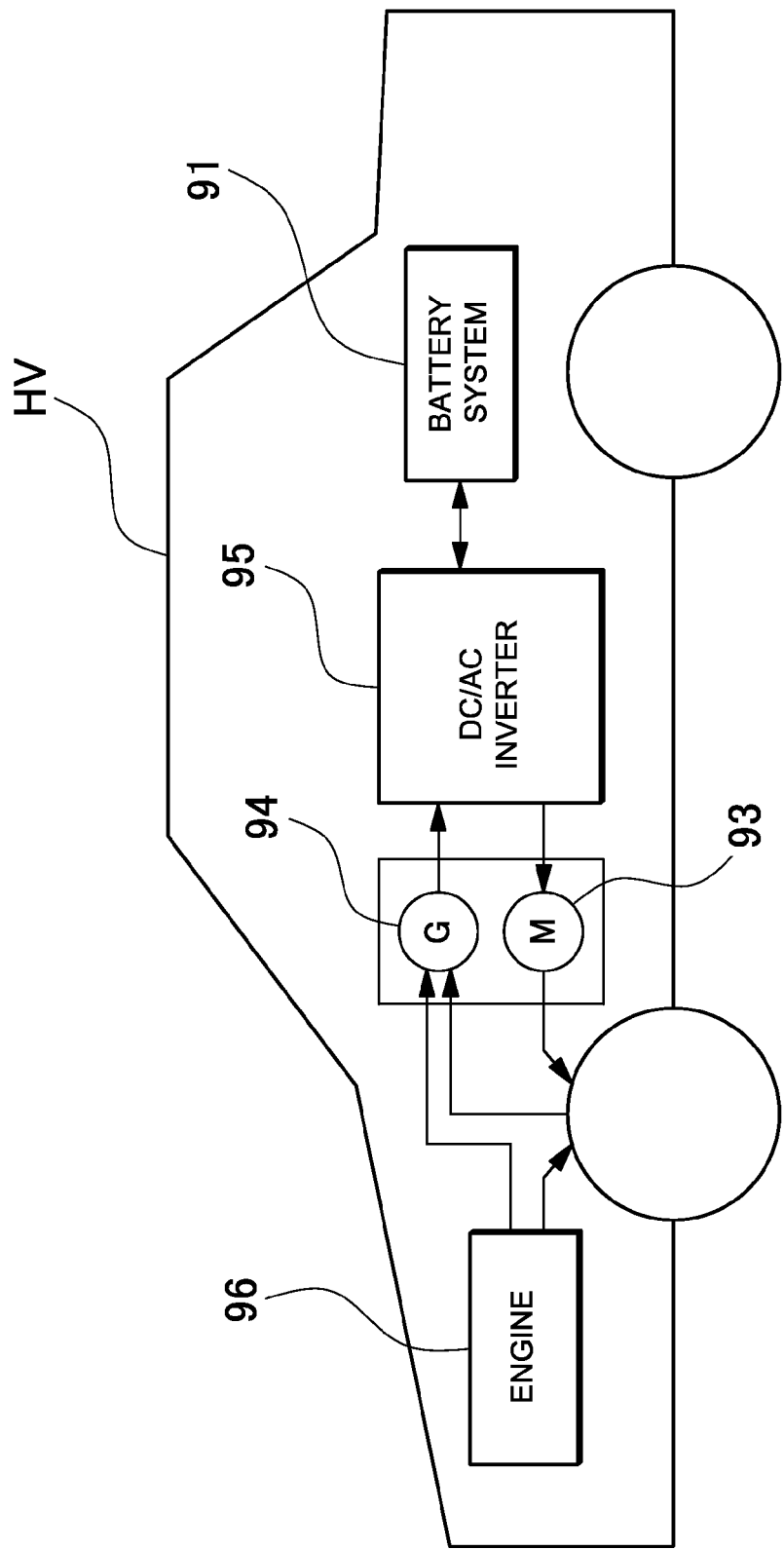
FIG. 9: Block diagram showing an exemplary hybrid car that is driven by an internal-combustion engine and an electric motor, and includes a battery system.
Figure 10:
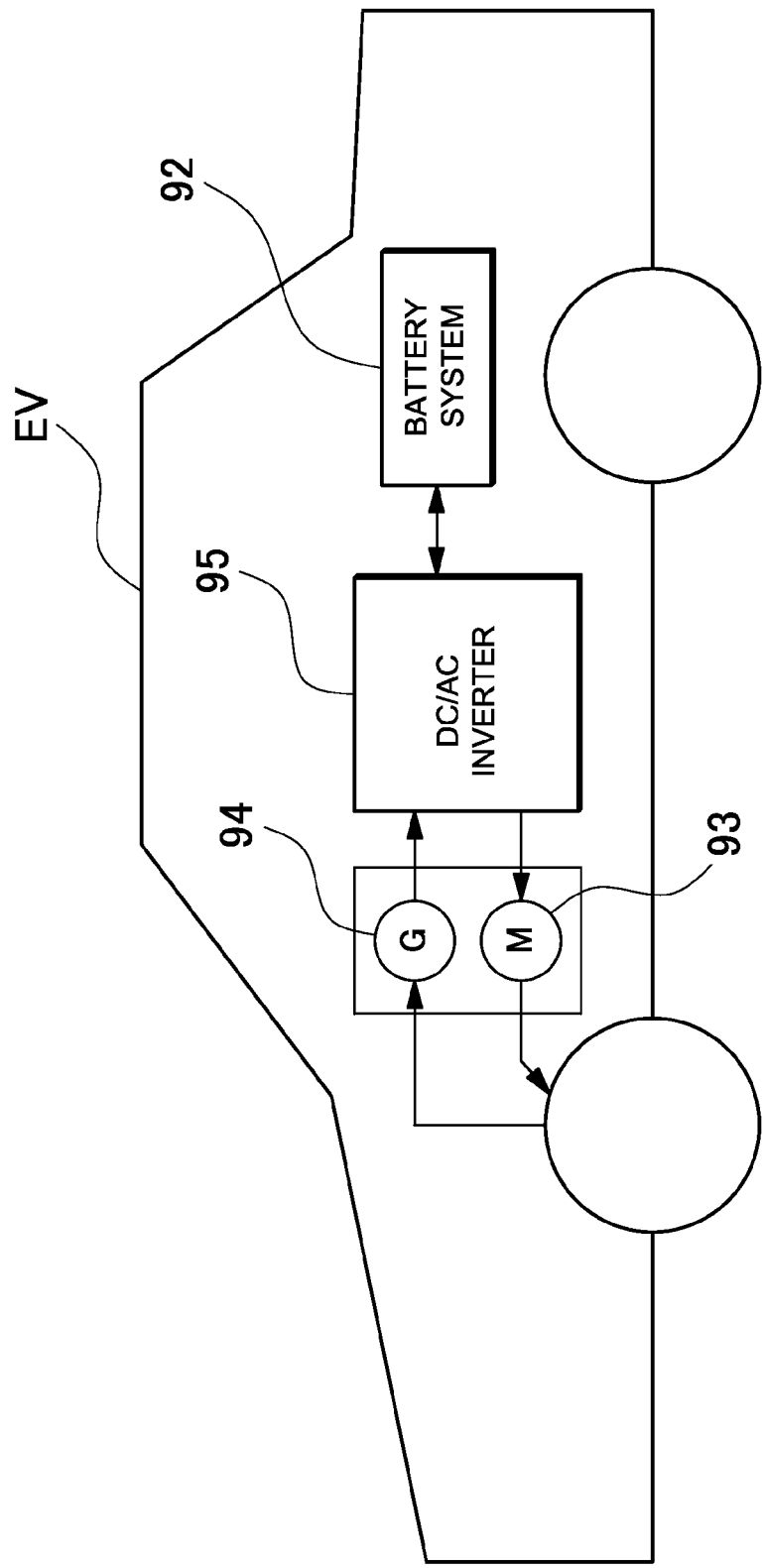
FIG. 10: Block diagram showing an exemplary electric car that is driven by only an electric motor, and includes a battery system.

With reference to FIGS. 9 and 10, a vehicle is now described which includes the aforementioned power supply device using the battery cells. FIG. 9 shows a hybrid car HV as the vehicle that includes the vehicle battery system, and is driven both by an internal-combustion engine 96 and an electric motor 93. The illustrated hybrid car includes the internal-combustion engine 96, the electric motor 93, the battery system 91, and an electric generator 94. The internal-combustion engine 96 and the electric motor 93 drive the vehicle. The battery system supplies electric power to the electric motor 93. The electric generator 94 charges batteries of the battery system 91. The battery system 91 is connected to the electric motor 93 and the electric generator 94 through a DC/AC inverter 95. The hybrid car is driven both by the electric motor 93 and the internal-combustion engine 96 with the batteries of the battery system 91 being charged/discharged in traveling. The electric motor 93 is energized and drives the vehicle in a poor engine efficiency range, e.g., in acceleration or in a low speed range. The electric motor 93 is energized by electric power that is supplied from the battery system 91. The electric generator 94 is driven by the engine 96 or by regenerative braking during vehicle braking so that the batteries of the battery system 91 are charged.

FIG. 10 shows an electric car EV as the vehicle that includes the vehicle battery system, and is driven only by the electric motor 93. The illustrated electric car includes the electric motor 93, the battery system 92, and the electric generator 94. The electric motor 93 drives the vehicle. The battery system supplies electric power to the electric motor 93. The electric generator 94 charges batteries of the battery system 92. The battery system 92 is connected to the electric motor 93 and the electric generator 94 through the DC/AC inverter 95. The electric motor 93 is energized by electric power that is supplied from the battery system 92. The electric generator 94 can be driven by vehicle regenerative braking so that the batteries of the battery system 92 can be charged.

(Power Storage Type Power Supply Device)

Figure 11:
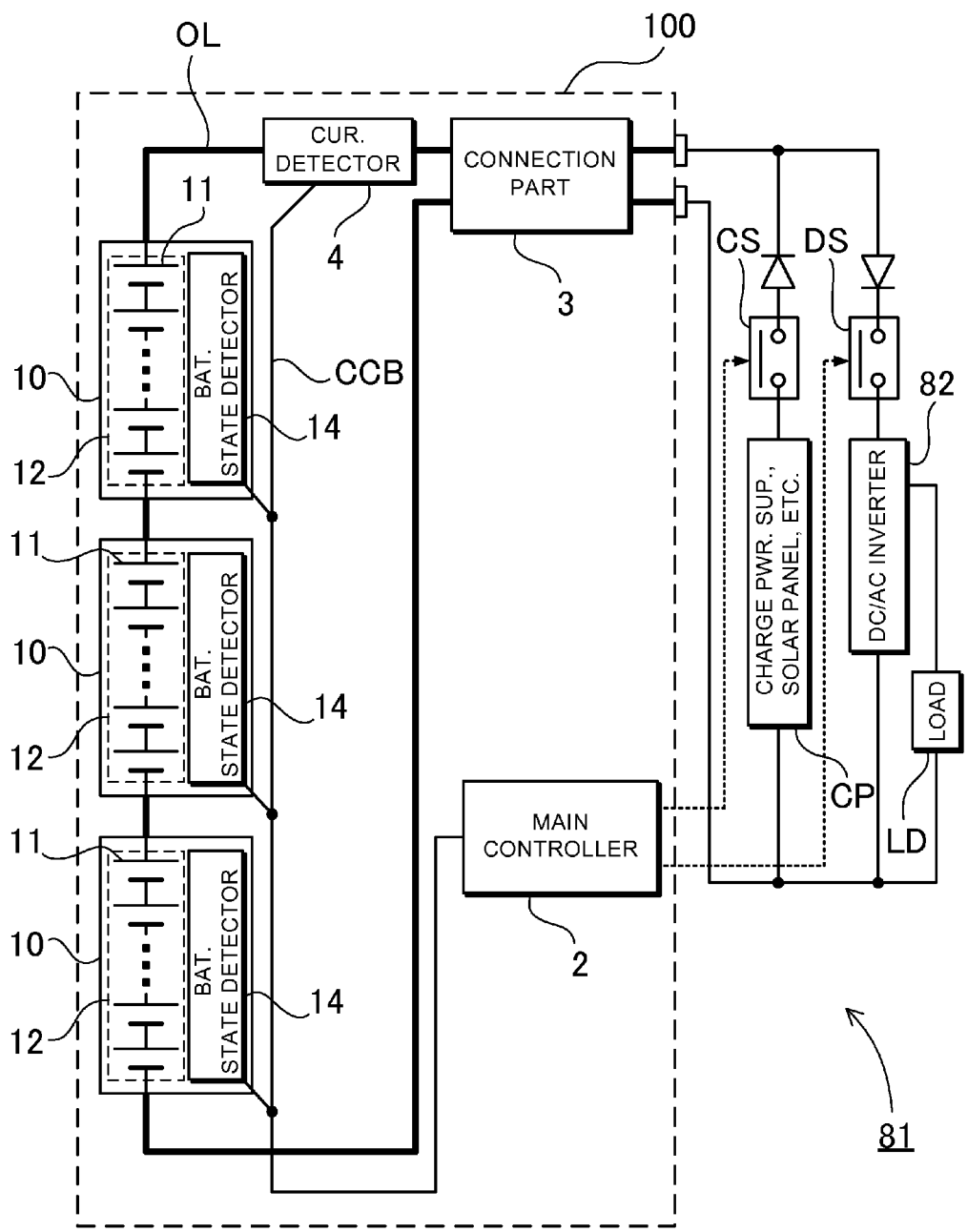
FIG. 11: Block diagram of a power supply device used as a power storage type power supply device.

FIG. 11 shows the power supply device 100 that is used as electric power storage equipment. For example, the power supply device 100 can be used as battery systems such as an electric power system for home use or plant use that can be charged with solar electric power or with midnight electric power and can be discharged when necessary, a power supply for street lights that can be charged with solar electric power during the daytime and be discharged during the nighttime, or a backup power supply for signal lights that drives signal lights in the event of a power failure. This illustrated power supply device 100 includes the battery blocks 12 that are connected in series to each other. Each of the battery blocks 12 includes the battery cells 11 that are connected in series to each other. In this battery system 81, a charging power supply CP and a load LD are connected to the power supply device 100 through charging and discharging switches CS and DS. The power supply device 100 can be charged by the charging power supply CP, and can supply electric power to the load LD through a DC/AC inverter 82. In the battery system 81, the charging and discharging switches CS and DS are controlled by the main controller 2 so that the controller switches between charging and discharge modes. The charging and discharging switches CS and DS are turned ON/OFF by the main controller 2. In the charging mode, the main controller 2 turns the charging operation switch CS ON, and turns the discharging switch DS OFF so that the power supply device 100 can be charged by the charging power supply CP. After charged, if the charged power supply device 100 is fully charged or charged to not less than a predetermined capacity, the main controller 2 can turn the discharging switch DS ON based on the request from the load LD so that the load LD can be supplied with electric power. In this case, the charging switch CS is turned ON or OFF. In the case where both the charging and discharging switches CS and DS are turned ON, the battery system 81 can supply electric power to the load LD while the power supply device is charged.

When driven by the power supply device 100, the load LD is connected to the power supply device 100 through the discharging switch DS. In the discharging mode of the battery system 81, the main controller 2 turns the discharging switch DS ON so that the power supply device 100 is connected to the load LD. Thus, the load LD is driven by electric power from the power supply device. Switching elements such as FET and relay can be used as the discharging switch DS. The discharging switch DS is turned ON/OFF by the main controller 2 of the power supply device 100. The main controller 2 includes a communication interface for communicating with an external device. The battery system 81 is connected to the load and the charging power supply through communication interface based on existing communications protocols such as UART and RS-232C.

A power supply device according to the present invention can be suitably used as power supply devices of plug-in hybrid vehicles and hybrid electric vehicles that can switch between the EV drive mode and the HEV drive mode, electric vehicles, and the like. A vehicle including this power supply device according to the present invention can be suitably used as plug-in hybrid vehicles, hybrid electric vehicles, electric vehicles, and the like.

The invention claimed is:

1. A power supply device comprising:
    a plurality of functional modules; and
    a main controller that is connected to and controls said plurality of functional modules, wherein each of said plurality of functional modules comprises
        a battery block that includes a plurality of battery cells connected in serial and/or in parallel to each other,
        a communication interface that exchanges data with other of the functional modules or said main controllers,
        a memory portion that can store data that is exchanged through said communication interface, and
        a battery state detection portion that can detect at least one of current, voltage and temperature of said battery block,
    wherein when the functional module is connected to said main controller, the main controller assigns a unique address to the functional module,
    wherein said functional module stores the unique address, which is assigned by said main controller, in said memory portion,
    wherein said functional module exchanges data based on the address,
    wherein said memory portion is a nonvolatile memory,
    wherein said plurality of functional modules are connected to said main controller through said communication bus in the power supply device assembling process,
    wherein said main controller assigns the unique addresses to the functional modules through said communication bus in the order of the turning-on of the power to the functional modules, wherein said functional modules store their unique addresses in said nonvolatile memories when recognizing the unique addresses, and wherein said functional modules exchange data based on the unique addresses on next startup.

2. The power supply device according to claim 1, wherein said plurality of functional modules and the main controller are connected through a communication bus to each other.

3. The power supply device according to claim 1, wherein said main controller is connected to the functional modules through startup signal lines (AC) through which startup signals are transmitted for activating/deactivating the functional modules, wherein on startup of the power supply device, said main controller transmits the startup signals to the functional modules through said startup signal lines (AC) so that the functional modules are activated, and the main controller assigns the unique addresses to the functional modules, and transmits the unique addresses through the communication bus to the functional modules, and wherein said functional modules store their unique addresses in said nonvolatile memories when recognizing the unique addresses, and wherein said functional modules exchange data based on the unique addresses on next startup.

4. The power supply device according to claim 1, wherein on startup of the power supply device, if one of said functional modules has not stored its unique address, the one of said functional modules transmits an identification signal to another of said functional modules that is connected on the upstream side relative to the one of said functional modules based on an identification signal that is transmitted from said main controller, wherein the upstream end module of the functional modules that is connected at the upstream end without connection to the functional module on the upstream side creates and stores its unique address based on the identification signal, and transmits the unique address to the downstream-side module of the functional modules that is connected on the downstream side relative to the upstream end module, and the downstream-side functional module creates and stores its unique address based on the unique address that is transmitted from the upstream-end functional module, wherein the unique addresses are assigned to the functional modules by sequentially repeating said unique address transmission, and wherein the functional modules exchange data with said main controller based on their assigned unique addresses.

5. The power supply device according to claim 1, wherein said power supply device is a vehicle power supply device.

6. The power supply device according to claim 1, wherein said power supply device is a power storage type power supply device.

7. A vehicle comprising the power supply device according to claim 1.

8. A power supply device comprising:
a plurality of functional modules; and
a main controller that is connected to and controls said plurality of functional modules, wherein each of said plurality of functional modules comprises
a battery block that includes a plurality of battery cells connected in serial and/or in parallel to each other,
a communication interface that exchanges data with other of the functional modules or said main controllers,
a memory portion that can store data that is exchanged through said communication interface, and
a battery state detection portion that can detect at least one of current, voltage and temperature of said battery block, wherein when said functional module is connected to said main controller, the main controller assigns a unique address to the functional module, wherein said functional module stores the unique address, which is assigned by said main controller, in said memory portion, wherein said functional module exchanges data based on the address, wherein said memory portion is a nonvolatile memory, wherein said main controller is connected to the functional modules through startup signal lines (AC) through which startup signals are transmitted for activating/deactivating the functional modules, wherein on startup of the power supply device, said main controller transmits the startup signals to the functional modules through said startup signal lines (AC) so that the functional modules are activated, and the main controller assigns the unique addresses to the functional modules, and transmits the unique addresses through the communication bus to the functional modules, wherein said functional modules store their unique addresses in said nonvolatile memories when recognizing the unique addresses, and wherein said functional modules exchange data based on the unique addresses on next startup.

9. A power supply device comprising:
a plurality of functional modules; and
a main controller that is connected to and controls said plurality of functional modules, wherein each of said plurality of functional modules comprises
a battery block that includes a plurality of battery cells connected in serial and/or in parallel to each other,
a communication interface that exchanges data with other of the functional modules or said main controllers,
a memory portion that can store data that is exchanged through said communication interface, and
a battery state detection portion that can detect at least one of current, voltage and temperature of said battery block, wherein when said functional module is connected to said main controller, the main controller assigns a unique address to the functional module, wherein said functional module stores the unique address, which is assigned by said main controller, in said memory portion, wherein said functional module exchanges data based on the address, wherein said memory portion is a nonvolatile memory, wherein on startup of the power supply device, if one of said functional modules has not stored its unique address, the one of said functional modules transmits an identification signal to another of said functional modules that is connected on the upstream side relative to the one of said functional modules based on an identification signal that is transmitted from said main controller, wherein the upstream end module of the functional modules that is connected at the upstream end without connection to the functional module on the upstream side creates and stores its unique address based on the identification signal, and transmits the unique address to the downstream-side module of the functional modules that is connected on the downstream side relative to the upstream end module, and the downstream-side functional module creates and stores its unique address based on the unique address that is transmitted from the upstream-end functional module, wherein the unique addresses are assigned to the functional modules by sequentially repeating said unique address transmission, and wherein the functional modules exchange data with said main controller based on their assigned unique addresses.

* * * * *